(12) United States Patent
Lee et al.

(10) Patent No.: US 11,067,620 B2
(45) Date of Patent: Jul. 20, 2021

(54) HEMT WAFER PROBE CURRENT COLLAPSE SCREENING

(71) Applicant: Texas Instruments Incorporated, Dallas, TX (US)

(72) Inventors: Dong Seup Lee, McKinney, TX (US); Jungwoo Joh, Allen, TX (US); Pinghai Hao, Plano, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 16/400,336

(22) Filed: May 1, 2019

(65) Prior Publication Data
US 2020/0064394 A1 Feb. 27, 2020

Related U.S. Application Data

(60) Provisional application No. 62/720,730, filed on Aug. 21, 2018.

(51) Int. Cl.
*G01R 31/26* (2020.01)
*G01R 27/26* (2006.01)

(52) U.S. Cl.
CPC ......... *G01R 31/2621* (2013.01); *G01R 27/26* (2013.01)

(58) Field of Classification Search
CPC ............ G01R 31/2887; G01R 31/2889; G01R 31/2831; G01R 31/2886; G01R 1/06711; G01R 31/31905; G01R 31/2891; G01R 31/2851; G01R 1/06705; G01R 31/3025; G01R 31/31924; G01R 1/0675; G01R 1/06766; G01R 27/08; G01R 1/07385; G01R 31/2621; G01R 31/31713; G01R 1/06777; G01R 1/07392; G01R 31/311; G01R 35/005; G01R 19/0023; G01R 31/26; G01R 1/067; G01R 1/07364; G01R 31/2601; G01R 31/2642; G01R 31/275; G01R 31/28; G01R 31/2808; G01R 31/2855; G01R 31/2879; G01R 31/2896; G01R 15/04; G01R 19/0084; G01R 27/02; G01R 31/2617; G01R 31/2639; G01R 27/26; H01L 2924/00; H01L 2924/1306;

(Continued)

(56) References Cited

U.S. PATENT DOCUMENTS 5,905,384 A * 5/1999 Inoue ................. G01R 31/2625
257/48
6,812,730 B2 * 11/2004 Pan ..................... G01R 31/2621
324/762.09

(Continued)

*Primary Examiner* — Vinh P Nguyen
(74) *Attorney, Agent, or Firm* — Rose Alyssa Keagy; Charles A. Brill; Frank D. Cimino

(57) ABSTRACT

A method includes applying a DC stress condition to a transistor for a predetermined stress time, measuring an impedance of the transistor after the predetermined stress time, and repeating the application of the DC stress condition and the measurement of the impedance until the measured impedance exceeds an impedance threshold or a total stress time exceeds a time threshold, where the DC stress condition includes applying a non-zero drain voltage signal to a drain terminal of the transistor, applying a gate voltage signal to a gate terminal of the transistor, and applying a non-zero source current signal to a source terminal of the transistor.

20 Claims, 4 Drawing Sheets

(58) Field of Classification Search
CPC .......... H01L 2924/13091; H01L 29/93; H01L 22/34; H01L 29/0847; H01L 29/0891; H01L 29/1066; H01L 29/1029; H01L 29/41725; H01L 29/41758; H01L 29/7782; H01L 21/26546; H01L 29/4966; H02M 3/33507
See application file for complete search history.

(56) References Cited

U.S. PATENT DOCUMENTS

| | | | | |
|---|---|---|---|---|
| 7,242,200 | B2* | 7/2007 | Okawa | G01R 31/2621 |
| | | | | 324/713 |
| 7,429,869 | B2* | 9/2008 | Okawa | G01R 31/2621 |
| | | | | 324/762.09 |
| 7,616,014 | B1* | 11/2009 | Sobolewski | G01R 31/2603 |
| | | | | 257/48 |
| 8,854,065 | B2* | 10/2014 | Mauder | G01R 19/0092 |
| | | | | 324/691 |
| 9,476,933 | B2* | 10/2016 | Joh | G01R 31/2621 |
| 9,531,186 | B2* | 12/2016 | Yagyu | G01R 19/0092 |
| 9,778,311 | B2* | 10/2017 | Ikeda | G01R 31/2621 |
| 9,891,265 | B2* | 2/2018 | Hirose | G01R 1/06766 |
| 10,094,863 | B2* | 10/2018 | Bahl | G01R 19/0084 |

* cited by examiner

HEMT WAFER PROBE CURRENT COLLAPSE SCREENING

REFERENCE TO RELATED APPLICATION

Under 35 U.S.C. § 119, this application claims priority to, and the benefit of, U.S. provisional patent application No. 62/720,730, entitled "Current Collapse Screening Methodology for GaN High Voltage Devices", and filed on Aug. 21, 2018, the entirety of which is hereby incorporated by reference.

BACKGROUND

High-electron-mobility transistors (HEMTs) exhibit performance advantages compared with silicon transistors, including high gain, low channel impedance, and improved high-frequency operation. Electronic device fabrication processes typically include wafer testing to evaluate the reliability of fabricated transistors. Current collapse in HEMT devices relates to dynamic drift or change in the device impedance (e.g., changing drain-source on-state resistance or RDSON). Current collapse is an important measure of transistor reliability, particularly for high voltage devices. In addition, current collapse is often sensitive to manufacturing process variations. Current collapse can result from high electric fields and leakage current during device off-state conditions, as well as by hot carrier affects during hard switching. Double pulse switching can be used to test HEMT current collapse. This technique provides hard switching stress by switching attested transistor between an on state and an off state. However, double pulse switching suffers from long test time, high cost for set up sensitivity, and is generally unsuitable or undesirable for wafer testing during production.

SUMMARY

A method is described, including applying a DC stress condition to a transistor with source current control for a predetermined stress time, and measuring an impedance of the transistor after the predetermined stress time. The method includes repeating the application of the DC stress condition and the measurement of the impedance until the measured impedance exceeds an impedance threshold or a total stress time exceeds a time threshold. The DC stress condition includes applying a non-zero drain voltage signal to a drain terminal of the transistor, applying a gate voltage signal to a gate terminal of the transistor, and applying a non-zero source current signal to a source terminal of the transistor.

Another example method includes testing multiple HEMTs at respective locations of a wafer by applying a DC stress condition and measuring an impedance of the HEMT and identifying a wafer guard band radius between a first HEMT at a respective first wafer location identified as passed, and a second HEMT at a respective second wafer location identified as failed.

A wafer test system includes a current source, a first voltage source, a second voltage source, an impedance measurement circuit, and a controller configured to control the current source and the voltage sources to apply a DC stress condition to the transistor for a predetermined stress time. The controller is configured to control the impedance measurement circuit to measure an impedance of the transistor after the predetermined stress time and repeats the application of the DC stress condition and the measurement of the impedance until the measured impedance exceeds a non-zero impedance threshold or a total stress time exceeds a non-zero time threshold. The controller is configured to identify the transistor as failed if the measured impedance exceeds the non-zero impedance threshold, and to identify the transistor as passed if the total stress time exceeds the non-zero time threshold.

DETAILED DESCRIPTION

Figure 1:
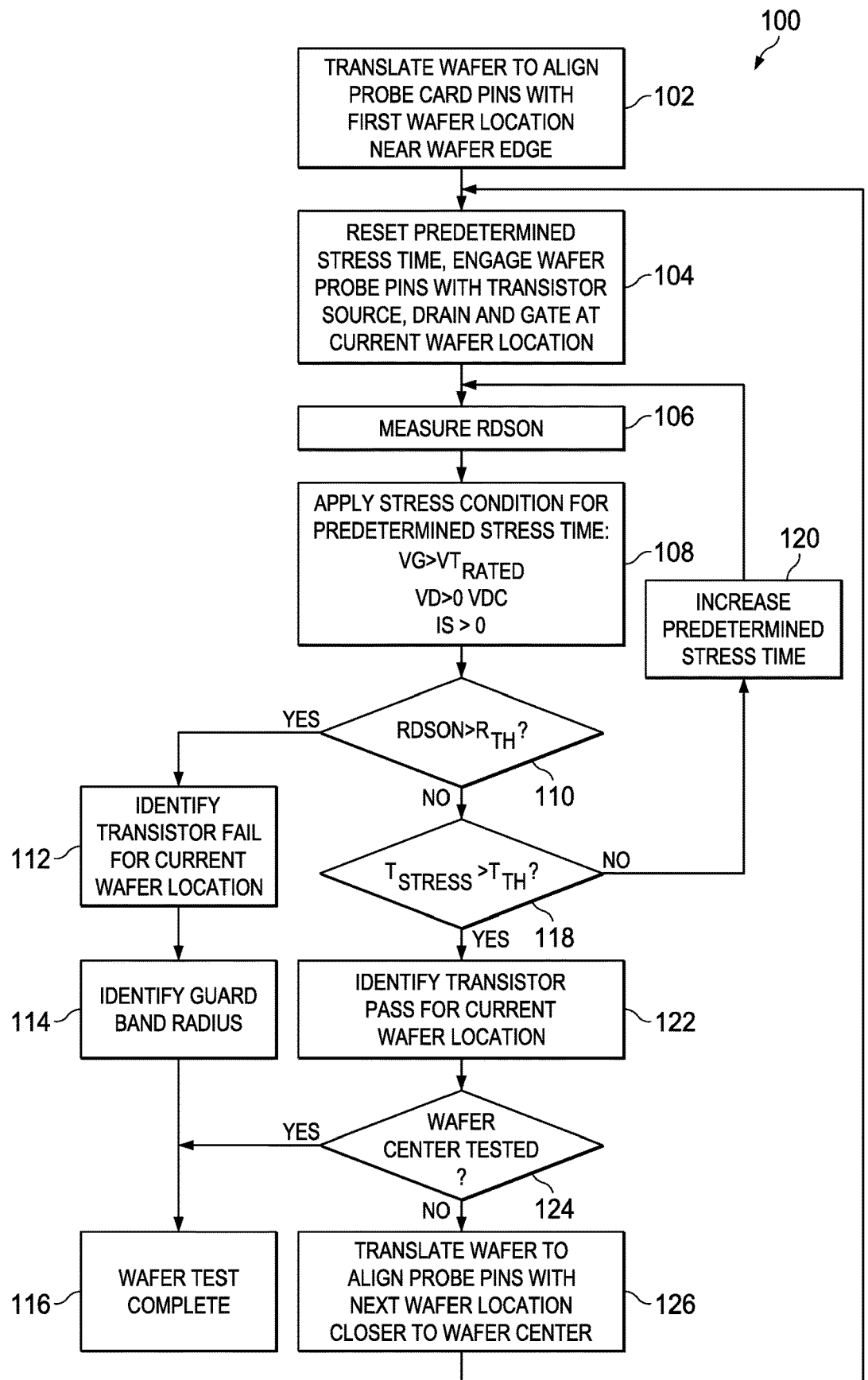
FIG. 1 is a flow chart of a wafer probe test method to test HEMT device current collapse performance.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Described transistor current collapse testing techniques and systems provide DC based transistor switching reliability testing using source side current control under high drain voltage stress to maintain the constant channel current in a semi-on state. This technique has advantages over hard switching tests, including shortened test time, lower cost and robustness with respect to process variation and transistor threshold voltage drift. Described provide test results and screening at wafer test with good correlation to package-level switching tests. The described techniques can be used in conjunction with different stress current profiles, for example, to test multiple transistor types within a given wafer.

FIG. 1 shows an example method 100, which can be used for wafer level current collapse testing of one or more transistors of a wafer. The method 100 and example test systems are described in connection with current collapse testing of gallium nitride (GaN) high voltage transistors or other HEMT devices, although the described techniques and apparatus can be used in connection with testing other transistor types. The example method 100 is illustrated for a wafer probe test operation to test multiple transistors different respective locations of the wafer, although not a strict requirement of all possible implementations. The method 100 includes translating the wafer at 102 to align probe card pins with a first wafer location near an outer peripheral edge of the wafer. At 104, the method 100 includes resetting a predetermined stress time and engaging the wafer probe pins with conductive features of the wafer associated with a transistor source, drain, and gate at the current wafer location. In one example, the transistor is a high electron mobility transistor HEMT, such as a high voltage GaN field effect transistor (FET).

Continuing at 106, the method 100 also includes measuring the impedance of the transistor after the predetermined stress time. In one example, the measurement at 106 includes measuring a drain-source on-state resistance (e.g., RDSON) of the transistor. The method 100 also includes applying a DC stress condition at 108. The method 100 in one example provides for selectively repeating the measurement of the impedance at 106 and the application of the DC stress condition at 108 until the measured impedance (e.g., RDSON) exceeds a non-zero impedance threshold $R_{TH}$ or a total stress time (e.g., $T_{STRESS}$) exceeds a non-zero time threshold $T_{TH}$. The total stress time $T_{STRESS}$ for a given tested transistor of a wafer means the total sum of multiple instances of the predetermined stress time during which the DC stress condition is applied to the transistor at 108 for the given tested transistor. In one example, the predetermined stress time at 108 for each iteration is significantly greater than the time during which the impedance measurement is made at 106. In this manner, the stress application is a significantly larger portion of the testing time, and a given transistor can be tested with respect to current collapse in a significantly shorter total test time, compared with dual pulse testing approaches.

The method 100 continues at 108 with applying a DC stress condition to the transistor at the current wafer location for a predetermined stress time. In one example, the application of the DC stress condition at 108 includes applying a constant non-zero drain voltage signal (VD) to a drain terminal of the transistor, applying a DC gate voltage signal (VG) to a gate terminal of the transistor, and applying a non-zero source current signal (IS) to a source terminal of the transistor. This technique provides source current controlled semi-on state DC stress, in contrast to dual pulse testing where the transistor is switched between an on state and an off state. Providing the DC gate voltage signal in one example provides semi-on state stress at 108, and the non-zero source current signal facilitates consistent DC stress to the device, even in the presence of variations in the threshold voltage of the tested transistor. In this manner, the example DC stress condition at 108 generally continuously stresses the tested transistor, in contrast to hard switching testing that only turns the transistor on for a short interval in each switching cycle.

In one example, applying the non-zero source current signal to the source terminal of the transistor includes sinking a constant non-zero current IS from the source terminal of the transistor during the predetermined stress time (e.g., 6 mA/mm of gate length). In one example, applying the non-zero drain voltage signal to the drain terminal of the transistor includes applying a constant non-zero drain voltage signal VD (e.g., 500 VDC) to the drain terminal of the transistor during the predetermined stress time, such as a rated voltage of the transistor, or a voltage within 20% of the rated voltage for the transistor. In one example, applying the DC gate voltage signal to the gate terminal of the transistor includes applying a constant DC gate voltage signal VG (e.g., −14 VDC) to the gate terminal of the transistor during the predetermined stress time, where the constant gate voltage signal is less than or equal to a rated threshold voltage of the tested transistor. The example method 100 includes determining at 110 whether the measured impedance (e.g., RDSON) exceeds the non-zero impedance threshold $R_{TH}$. If so (YES at one time), the method continues at 112, including identifying the transistor as failed if the measured impedance RDSON exceeds the non-zero impedance threshold $R_{TH}$ for the current wafer location. The example method 100 also includes identifying and recording a guard band radius at 114 in response to recording a transistor fail condition at 112, as well as completing the wafer test at 116. Current collapse exhibits radial pattern in some wafers. In this example, the wafer guard band radius recorded at 114 represents a radial location at a transistor of a respective first wafer location identified as passed, and a second transistor at a respective second wafer location identified as failed. In one example, such as for high voltage GaN transistors of a wafer, imperfections or inconsistencies in spin coated gallium nitride occur with a higher probability at the center of a wafer than at the outer peripheral edge of the wafer. The identification of the guard band radius at 114 facilitates expedited test time for a given tested wafer, for example, by beginning the test near the outer wafer edge (e.g., at 102 in FIG. 1), and discontinuing further testing after identification of the first recorded transistor failure at 112 on the assumption that further transistors closer to the wafer center will fail the current collapse stress testing. In one example, the method 100 also includes slicing the wafer after the wafer testing is completed at 116, and packaging a die associated with the wafer location having a transistor identified as passing the current collapse testing.

Returning to 110, if the measured impedance (e.g., RDSON) does not exceed the non-zero impedance threshold $R_{TH}$ (NO at 110), the method 100 proceeds to 118, including determining whether the total stress time $T_{STRESS}$ exceeds the non-zero time threshold $T_{TH}$. If not (NO at 118), the method again measures the transistor impedance at 106 and applies the stress at 108 for the predetermined stress time as described above. In one example, the method 100 includes increasing the predetermined stress time at 120 for each successive repetition of the application of the DC stress condition.

Returning to 118, if the total stress time $T_{STRESS}$ exceeds the non-zero time threshold $T_{TH}$ (YES at 118), the method 100 proceeds to 122, including identifying the transistor at the current location as passed. The example method 100 also includes determining at 124 whether the wafer center has been tested, indicating that all the wafer locations of interest have been evaluated. If not (NO at 124), the method 100 proceeds to 126, including translating the wafer to align the wafer probe pins with the next wafer location closer to the wafer center. Thereafter, the method 100 returns to 104, where the predetermined stress time is reset to the initial value, and the wafer probe pins are engaged with the transistor source, drain and gate at the new wafer location. The method 100 then continues as described above to implement semi-on state DC stress-based current collapse testing for further wafer locations and respective transistors. Otherwise (YES at 124), the method 100 proceeds to 116 with the wafer test completed.

Figure 2:
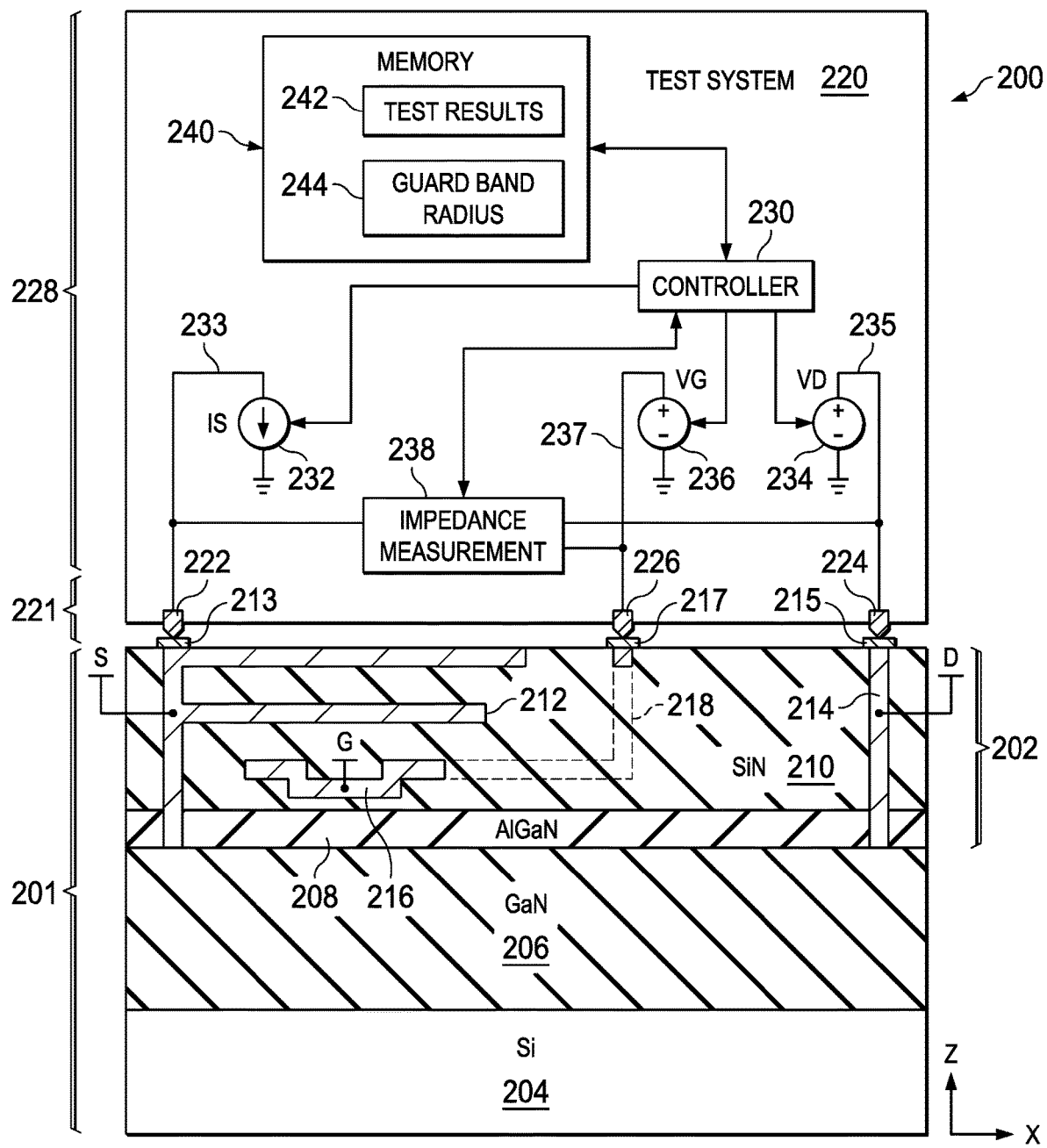
FIG. 2 is a partial schematic sectional side elevation view of a wafer with a gallium arsenide HEMT transistor in a wafer probe test system.
Figure 3:
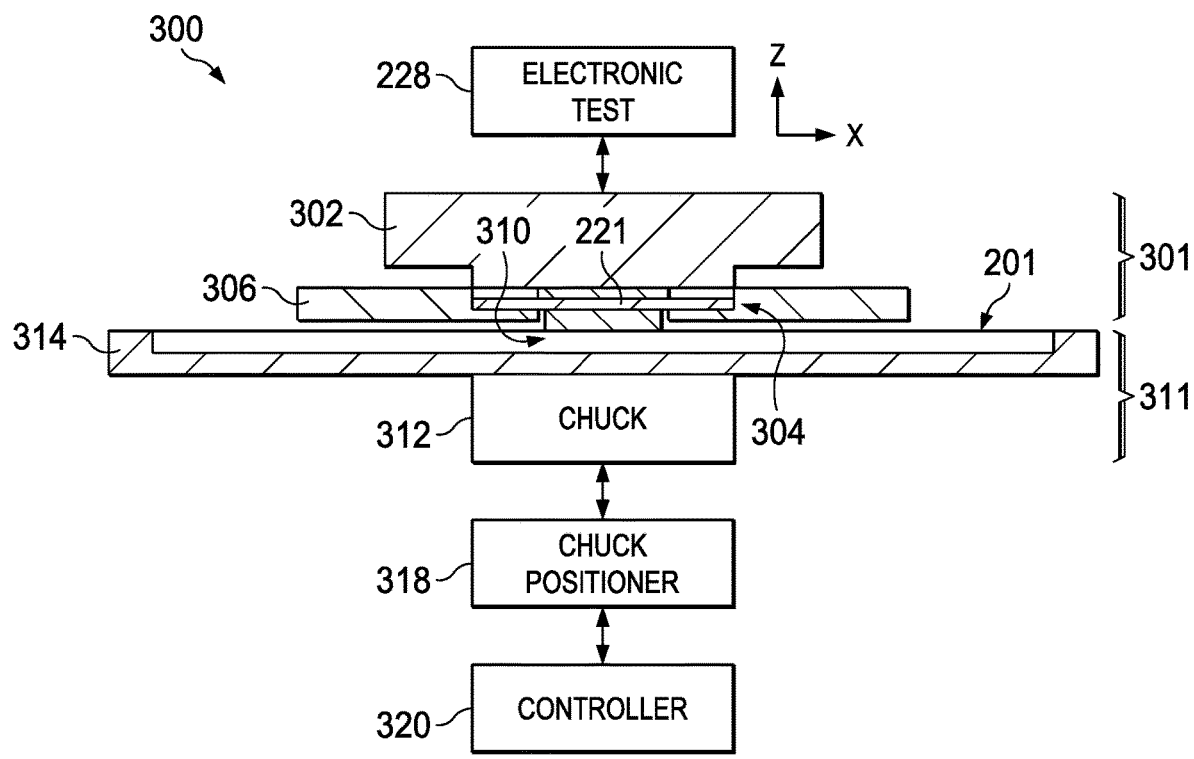
FIG. 3 is a simplified diagram of an automated wafer probe test system.

Referring now to FIGS. 2 and 3, FIG. 2 shows a wafer probe test setup 200 with a wafer 201 that includes a transistor 202 undergoing automated current collapse testing, and FIG. 3 shows further details of an example automated wafer probe test system that moves the wafer 201 relative to components of the test system for sequential testing of multiple transistors 202 at multiple respective locations of the wafer 201. The simplified view of FIG. 2 shows only one wafer location of the wafer 201. In one example, the wafer 201 includes multiple wafer locations with multiple respective transistors 202, as described further below in connection with FIG. 4. The example wafer 201 is a GaN-based structure, including a silicon (Si) substrate 204, and a GaN layer 206 formed on an upper side of the silicon substrate 204. The wafer 201 includes an aluminum gallium nitride (AlGaN) layer 208 formed on an upper side of the GaN layer 206. The layers 206 and 208 form a heterojunction with a junction between two materials with different band gaps. The junction provides a channel for the transistor 202. In other examples, a different type of heterojunction HEMT can be used in the respective wafer locations, such as including a junction between gallium arsenide (GaAs) and illumine in gallium arsenide (AlGaAs). In another example, the respective wafer locations of the wafer 201 include a non-heterojunction transistor (not shown).

A silicon nitride (SiN) layer 210 is formed on a top side of the AlGaN layer 208. In one example, the SiN layer 210 is a multilayer structure. In another example, the SiN layer 210 is a single layer structure. The transistor 202 includes a source terminal 212 (schematically labeled "S" in FIG. 2) connected to a first conductive feature 213 having an exposed portion accessible at a top side of the wafer 201. The transistor 202 includes a drain terminal 214 (labeled "D" in FIG. 2) connected to a second conductive feature 215 having an exposed portion accessible at the top side of the wafer 201. The transistor 202 also includes a gate terminal 216 (labeled "G" in FIG. 2) connected to a third conductive feature 217 having an exposed portion accessible at the top side of the wafer 201. The respective source, drain and gate terminals 212, 214 and 216 in one example are conductive structures, such as copper, aluminum, tungsten or combinations of these. In one example, SiN layer 210 is a multilayer structure and the terminals 212, 214 and 216 include conductive portions in one or more layers of the multilayer SiN layer 210. The source and drain terminals 212 and 214 in one example extend to the GaN layer 206. The example gate terminal 216 is a multi-level shape as shown in FIG. 2, and extends along the channel (along a direction into the page in the view of FIG. 2), with a connection to a conductive routing structure 218 (e.g., copper metallization layer routing features and/or inter-layer vias, etc.) shown in dashed line in FIG. 2. The source terminal 212 in one example includes field plate portions that extend along the X direction above at least a portion of the gate terminal 216.

One example of the illustrated GaN transistor 202 is a depletion mode transistor rated for 600 V high seed switching operation, with a rated off state gate-source voltage VG of −14 V. The transistor 202 includes the field plate portions of the source terminal 212 to control electric fields. The silicon nitride (SiN) layer 210 provides surface passivation for high voltage switching applications. Current collapse can increase the RDSON due to charge trapping in high voltage GaN HEMTs like the transistor 202, for example, because of hot electrons created during hard switching at high voltages and/or leakage current flowing during the off state. Double pulse testing uses hard switching between the off state and the on state with high drain voltages, but this technique suffers from long test time, high cost and setup sensitivity.

The wafer probe test setup 200 in FIG. 2 also includes a wafer test system 220. The wafer test system 220 in one example implements the test method 100 described above. Example implementations of the wafer test system 220 provide a DC-based solution with advantages over the double pulse testing approach, including shorter test times and lower cost, and provides good correlation to package-level switching test. In one example, test times are improved by over an order of magnitude for individual transistor tests, as described below in connection with FIG. 5. In this example, wafer test coverage is improved by a factor of three and test throughput is increased by about twenty times compared with dual pulse current collapse testing. High test throughput facilitates testing multiple wafer locations and guard banding of poor current collapse regions. Current collapse exhibits radial patterns in GaN wafers, where transistors at or near the center locations are more likely to fail the current collapse testing than transistors at outer locations nearer to the wafer edge. The test system 220 in one example evaluates current collapse pass or fail test results for multiple wafer locations with different radii and identifies a guard band radius between a first transistor 202 at a respective first wafer location identified as passed, and a second transistor 202 at a respective second wafer location identified as failed. In one implementation, the testing starts at the wafer edge and progress radially inward as described in FIG. 1 above, and the testing can be terminated once a failure is detected.

The wafer test system 220 in FIG. 2 includes a probe card 221 with probe pins 222, 224, 226 that extend outward from a bottom side of the probe card 221. The system 220 includes apparatus (e.g., described below in connection with FIG. 3) to move the wafer 201 relative to the probe card 221 to selectively couple (e.g., mechanically engage or contact) the probe pins to conductive features of the wafer 201 for electrical testing of the transistor 202 of the wafer 201. The probe card 221 includes a first probe pin 222 adapted to be coupled to the first conductive feature 213 of the wafer 201 to electrically connect the test system 220 to the source terminal 212 of the transistor 202. The probe card 221 also includes a second probe pin 224 adapted to be coupled to the second conductive feature 215 of the wafer 201 to electrically connect the test system 220 to the drain terminal 214 of the transistor 202. In addition, the probe card 221 includes a third probe pin 226 adapted to be coupled to the third conductive feature 217 of the wafer 201 to electrically connect the test system 220 to the gate terminal 216 of the transistor 202.

The wafer test system 220 in FIG. 2 also includes an electronic test circuit 228 connected to the first, second, and third probe pins 222, 224, and 226, respectively. The electronic test circuit 228 includes a controller 230, a current source 232 with a current source output 233, a first voltage source 234 with a first voltage source output 235, a second voltage source 236 with a second voltage source output 237, an impedance measurement circuit 238, and a memory 240. The memory 240 is configured to store test results 242 that indicate whether the respective transistors 202 of a tested wafer 201 were identified as failed or passed. In one example, the memory 240 is configured to store a wafer guard band radius 244. The coupling of the first probe pin 222 to the first conductive feature 213 as shown in FIG. 2 electrically connects the current source output 233 to the source terminal 212 of a transistor 202. The coupling of the second probe pin 224 to the second conductive feature 215 of the wafer 201 electrically connects the first voltage source output 235 to the drain terminal 214 of the transistor 202. Also, the coupling of the third probe pin 226 to the third conductive feature 217 of the wafer 201 electrically connects the second voltage source output 237 to the gate terminal 216 of the transistor 202. The impedance measurement circuit 238 includes respective inputs connected to the first and second probe pins 222 and 224 for coupling to the source terminal 212 and to the drain terminal 214 of the transistor 202 to selectively measure an impedance of the connected transistor 202 under control of the controller 230. In one example, the impedance measurement circuit 238 is configured to measure an on-state drain-source resistance (e.g., RDSON) of the transistor 202.

The impedance measurement circuit 238 has an input connected to the second voltage source output 237 and to the probe pin 226 to measure the transistor gate voltage VG. The controller 230 in one example controls the impedance measurement circuit 238 to selectively measure the impedance of the connected transistor 202 before and between applications of the DC stress condition. The controller 230 also controls the voltage sources 234 and 236 during impedance measurements, and further controls the current source 232 during stress application. In one example, the impedance measurement circuit 238 measures the gate voltage VG at the probe pin 226 to verify a proper on state of the connected transistor before beginning the impedance measurement (e.g., at 106 in FIG. 1).

The controller 230 includes one or more processors or logic circuits or other components operatively coupled with the memory 240. The memory 240 stores processor executable program instructions that configure the controller 230 to implement automatic wafer probe testing as described herein. The controller 230 is configured to control the current source 232, the first voltage source 234, and the second voltage source 236 to apply a DC stress condition to the transistor 202 for a predetermined stress time, and to control the impedance measurement circuit 238 to measure the impedance of the transistor 202 after the predetermined stress time.

The controller 230 is configured to control the current source 232, the first voltage source 234, the second voltage source 236, and the impedance measurement circuit 238 to repeat the application of the DC stress condition and the measurement of the impedance until the earlier of the measured impedance RDSON exceeding the impedance threshold $R_{TH}$ or the total stress time $T_{STRESS}$ exceeding the non-zero time threshold $T_{TH}$. In one example, the impedance threshold $R_{TH}$ and the non-zero time threshold $T_{TH}$ are stored in the memory 240, and the controller 230 computes the total stress time $T_{STRESS}$ during which the DC stress condition is applied to the transistor 202. The controller 230 identifies the transistor 202 as failed if the measured impedance RDSON exceeds the non-zero impedance threshold $R_{TH}$ or identifies the transistor 202 as passed if the total stress time $T_{STRESS}$ exceeds the non-zero time threshold $T_{TH}$. The controller 230 stores the result 242 (e.g., pass or failed) for each tested transistor 202 in the memory 240. The predetermined stress time is stored in the memory 240. The controller 230 increases the predetermined stress time for each successive application of the DC stress condition to the transistor 202 and resets the predetermined stress time when transitioning to test another transistor 202.

The controller 230 is configured to control the current source 232 to generate a non-zero DC source current signal IS at the current source output 233 for the predetermined stress time. In the illustrated example, the controller 230 causes the current source output 233 to sink the non-zero DC source current signal IS from the transistor source terminal 212 by generating a control signal that activates the current source 232 connected as shown in FIG. 2. The controller 230 is configured to control the current source 232 to discontinue the non-zero DC source current signal IS while the impedance measurement circuit 238 measures the impedance of the transistor 202. The controller 230 is configured to control the first voltage source 234 to generate a non-zero DC drain voltage signal VD at the first voltage source output 235 for the predetermined stress time, and to control the second voltage source 236 to generate a DC gate voltage signal VG at the second voltage source output 237 for the predetermined stress time. The controller 230 is configured to control the first voltage source 234 to generate a second non-zero DC drain voltage signal VD while the impedance measurement circuit 238 measures the impedance of the transistor 202. The controller is configured to control the second voltage source 236 to generate a second DC gate voltage signal VG while the impedance measurement circuit 238 measures the impedance of the transistor 202. In one example, the second DC gate voltage signal is greater than or equal to the rated threshold voltage of the transistor 202 to at least partially turn the transistor 202 on to measure the drain-source on-state resistance (RDSON). In one example, the second non-zero DC drain voltage signal is less than or equal to the rated transistor voltage.

FIG. 3 shows an automated wafer probe test system or prober 300 which can be used to implement the test method 100 for testing a wafer. The system 300 is an example implementation using the test setup 200 of FIG. 2. The system 300 includes a probe head assembly 301 with a test head 302. The test head 302 includes conductive connections 304, such as pogo pins, that are electrically connected to the electronic test circuit 228 of FIG. 2. In one example, the conductive connections 304 are short profile pogo pins to facilitate high current testing. The conductive connections 304 extend into a recess in a head plate 306. As an example, the test head 302 and the head plate 306 can be ceramic material. The probe head assembly 301 also includes the probe card 221 described above in connection with FIG. 2. The probe card 221 is seated in the head plate recess. The probe card 221 includes top side pads electrically connected to the pogo pin conductive connections 304 of the test head 302. The probe card 221 includes probe pins 310 that extend downward (e.g., along the −Z direction in FIG. 3) through an opening in the bottom of the head plate 306 to contact a wafer under test (e.g., the wafer 201 of FIG. 2). The probe pins 310 in one example are an implementation of the wafer probe pins 222, 224 and 226 of FIG. 2. The electronic test circuit 228 in one example is configured to implement electrical testing of a probed wafer 201, such as the described current collapse testing described above in connection with FIGS. 1 and 2, and may also implement other wafer-level testing, such as tests for short circuit and open circuit faults and/or other operational functional tests.

The system 300 also includes a chuck apparatus 311 with a chuck 312 and an attached carrier 314 configured to support the wafer 201. The chuck 312 is mechanically supported and positioned by an attached chuck positioner apparatus 318. The chuck positioner apparatus 318 is configured to move or otherwise translate the chuck apparatus 311 between various chuck positions that engage conductive pads of select locations of the wafer 201 with probe pins 310 of the probe card 221. As an example, the chuck positioner apparatus 318 can include linear or rotary servos, positioner actuators and mechanical supporting structures to move the chuck 312, along with the associated carrier 314 and an installed wafer 201, to any position and orientation in a three-dimensional space relative to the position of the probe head assembly 301 and the probe pins 310 thereof. In one example, the positioner apparatus 318 is configured to move the wafer 201 relative to the probe card 221.

The wafer probe test system 300 also includes a second (e.g., central) controller 320. The second controller 320 can include one or more processor components and associated memory (not shown). In one example, the memory of the second controller 320 stores processor executable program instructions to implement translation of the apparatus 311 during transitions between probe locations on the wafer 201 and to allow installation and removal of processed wafers for probe testing. The second controller 320 in one example communicates with the controller 230 described above in connection with FIG. 2. During testing, the second controller 320 sends suitable signals or commands to the positioner apparatus 318 to position the chuck apparatus 311 in a location to contact the wafer 201 with the probe pins 310. In one example, the second controller 320 exchanges data and/or messages with the electronic test circuit 228 to command the electronic test circuit 228 to implement or execute wafer probe testing to implement one or more test routines or programs, such as current collapse tests, short circuit detection, open circuit detection, operational circuit testing, etc. In one example, the controller 320 implements automated current collapse testing of a single transistor 202 of the wafer 201, or current collapse testing of multiple transistors 202 according to the method 100 of FIG. 1.

Figure 4:
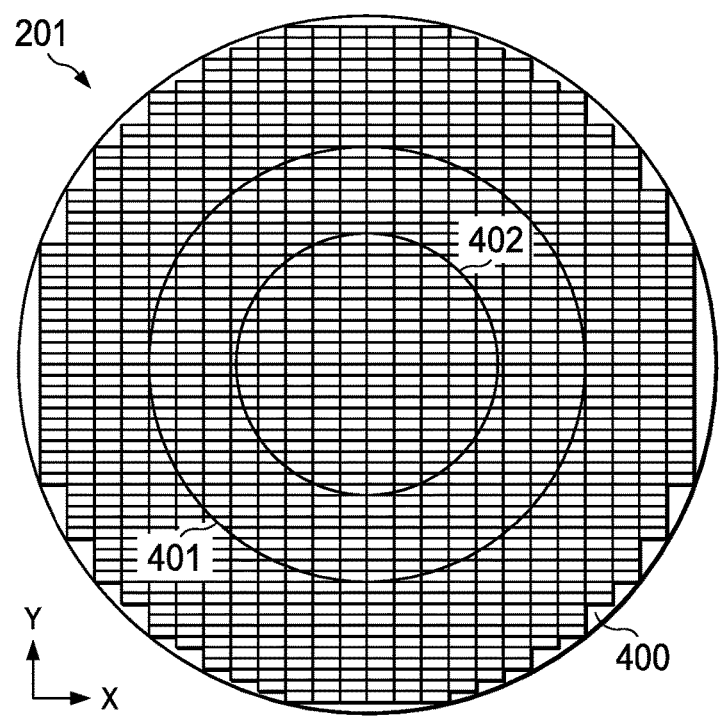
FIG. 4 is a top plan view of a wafer with multiple wafer locations.
Figure 5:
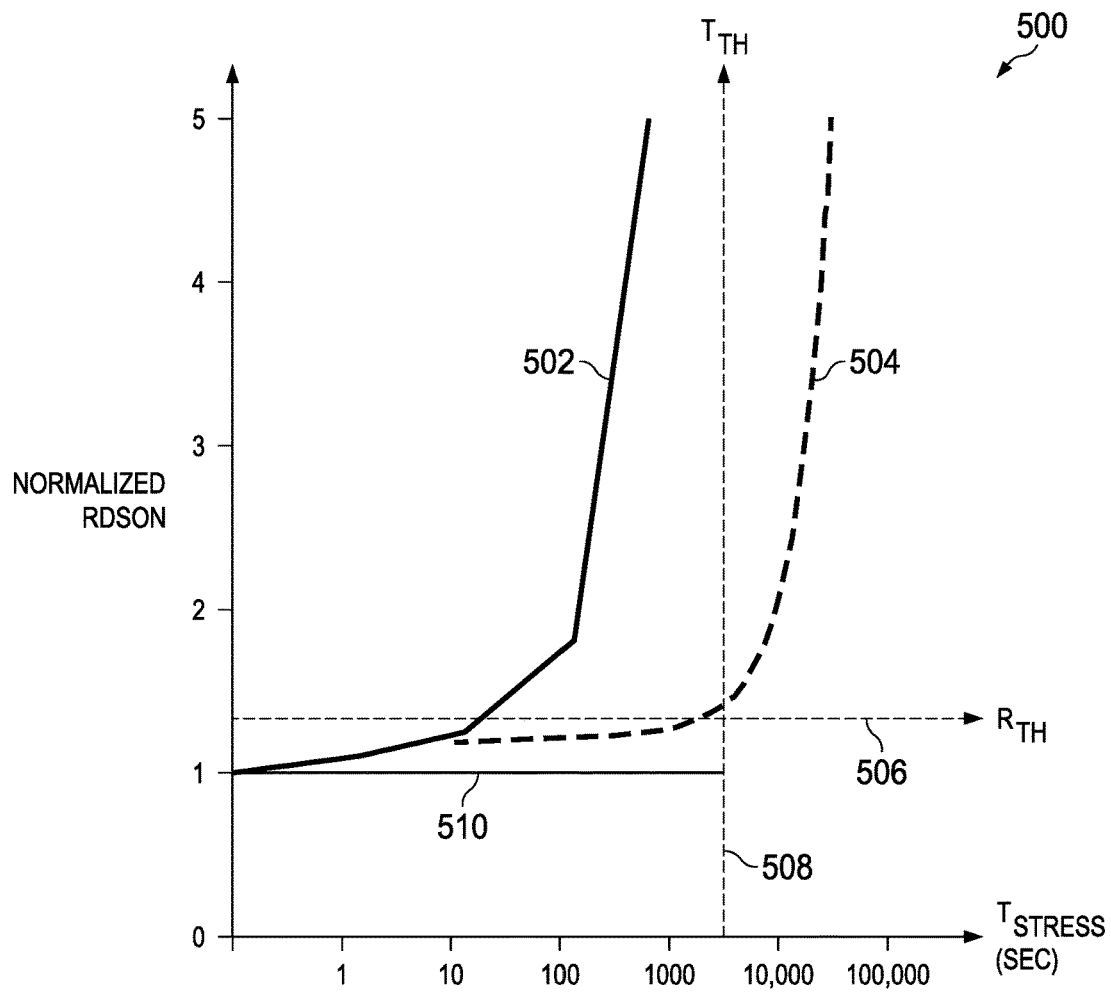
FIG. 5 is a graph of normalized drain-source on-state resistance for gallium arsenide HEMT transistors tested using the method of FIG. 1.

Referring also to FIGS. 4 and 5, FIG. 4 shows a top view of the wafer 201. The wafer 201 includes multiple wafer locations 400. FIG. 4 also shows two example radius lines 401 and 402. FIG. 5 shows a graph 500 with a curve 502 of normalized drain-source on-state resistance (RDSON) as a function of total stress time ($T_{STRESS}$) for GaN HEMT transistors failing the current collapse test according to the method of FIG. 1. A curve 504 shows RDSON values for similar GaN transistors failing a current collapse test using a previous dual pulse approach. FIG. 5 also shows an example non-zero impedance threshold 506 ($R_{TH}$) and an example non-zero time threshold 508 ($T_{TH}$). A curve 502 in FIG. 5 shows RDSON values for transistors 202 that passed the current collapse testing per the method 100 of FIG. 1.

The failing devices tested using the method 100 of FIG. 1 represented by the curve 502 exhibit increase RDSON above the threshold 506 significantly faster than those failing devices tested using the previous dual pulse approach (e.g., curve 504). The application of a DC stress condition in the method 100 more rapidly identifies current collapse in failing devices compared to use of the previous dual pulse approach, shown by the rise in the curve 502 occurring more than an order of magnitude faster than the rise in the curve 504. In response to a failing transistors tested under the method 100 of FIG. 1 exhibiting a measured RDSON at or above the threshold 506, that transistor is found to have failed and the testing of that transistor is completed much faster than was possible using the previous dual pulse approach represented by the curve 504. The testing of the devices that have measured RDSON values that remain below the threshold 506 for the threshold amount of stress time 508 is likewise terminated (e.g., curve 510) much quicker than possible using the previous dual pulse approach.

The second controller 320 in FIG. 3 is configured to control the positioner apparatus 318 to move the wafer 201 between different positions that couple respective conductive pads 213, 215, 217 of the wafer 201 to the first, second, and third probe pins 222, 224, 226 (FIG. 2) to sequentially test multiple transistors 202 at multiple respective wafer locations 400 (FIG. 4). In one example, the controller 230 is configured, for each respective transistor 202 and respective wafer location 400, to control the current source 232, the first voltage source 234, and the second voltage source 236 to apply the DC stress condition to the transistor 202 for the predetermined stress time, and to control the impedance measurement circuit 238 to measure the impedance of the transistor 202 after the predetermined stress time. The controller 230 in this example is configured to control the current source 232, the first voltage source 234, the second voltage source 236, and the impedance measurement circuit 238 to repeat the application of the DC stress condition and the measurement of the impedance until the measured impedance RDSON exceeds the non-zero impedance threshold 506, $R_{TH}$ or a total stress time $T_{STRESS}$ exceeds the non-zero time threshold 508, $T_{TH}$. The controller 230 identifies a given transistor 202 as failed if the measured impedance RDSON exceeds the non-zero impedance threshold 506, $R_{TH}$, and identifies the given transistor 202 as passed if the total stress time $T_{STRESS}$ exceeds the non-zero time threshold 508, $T_{TH}$. In one example, the controller 230 identifies a wafer guard band radius (e.g., 244 in FIG. 2, 401 or 402 in FIG. 4) between a first transistor 202 at a respective first wafer location 400 identified as passed, and a second transistor 202 at a respective second wafer location 400 identified as failed.

The radial nature of current collapse performance in GaN wafers facilitates test time reduction in certain implementations, in which transistors at or near the center locations are assumed to be more likely to have poor current collapse performance compared with transistors at outer locations nearer to the wafer edge. In one example, the current collapse testing begins at or near the wafer edge, and progresses toward the wafer center (e.g. FIG. 1 above), and may terminate in response to identification of a failed transistor (e.g., 112, 114). In one example, the controller 230, 320 identifies the guard band radius 401 in FIG. 4 in response to identification of a failed transistor and respective wafer region 400 radially outside the guard band radius line 401. In this example, further wafer regions 400 and respective transistors 202 are assumed to fail the current collapse testing, and the wafer test is completed (116 in FIG. 1) without spending time testing the wafer regions 400 radially within the identified guard band radius 401. If all tested wafer locations 400 and respective transistors 202 are identified as passing the test, the test completes when the wafer center has been tested (124 in FIG. 1). In another example, the current collapse testing begins at or near the wafer center, and proceeds radially outward toward the peripheral wafer edge. The controller 230 in this example continues testing until a wafer location 400 and respective transistor 202 are identified as passing the current collapse test, and the controller 230 identifies the guard band radius line (e.g., 401) radially between a region 400 having a pass test result and another region 400 having a fail test result. Different wafers 201 may yield different guard band radius lines, two examples of which 401 and 402 are illustrated in FIG. 4.

The described DC-based current collapse stress testing approaches can provide improvements compared with double pulse testing approach as shown in FIG. 5. In one example, the test time threshold 508 provides an outer boundary beyond which further testing is not needed to determine whether a tested transistor 202 passes or fails the current collapse test. In the example of FIG. 5, the failure curve 502 shows that failed transistors 202 are identified significantly faster than the stress time needed for the double pulse testing (curve 504). Described examples facilitate comparatively shorter test times and lower cost, and provide good correlation to package-level switching test. As shown in the example of FIG. 5, the test times are improved by more than an order of magnitude for individual transistor tests.

Figure 6:
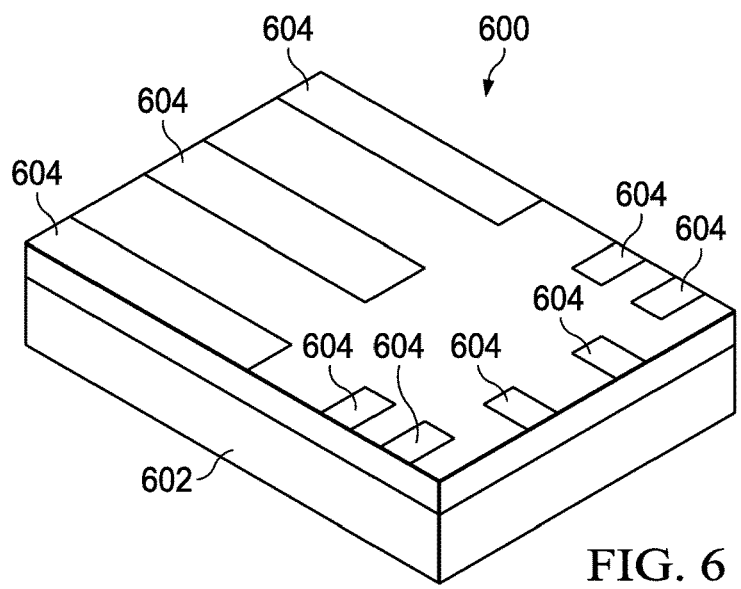
FIG. 6 is a bottom perspective view of a packaged electronic device.

FIG. 6 shows a packaged electronic device 600 in a molded quad flat module (QFM) package structure 602. After the above described current collapse wafer-level testing of FIG. 1, the tested wafer (e.g., wafer 201 in FIGS. 2-4)

is sliced (e.g., sawn) into two or more dies, including a first die corresponding to a first one of the wafer locations (e.g., 400 in FIG. 4) having a transistor that passed the testing. The die with the passing transistor is packaged using a packaging process (not shown) to produce the packaged electronic device 600 including the die and its transistor. FIG. 6 shows one example with a number of leads 602 having electrical connections to the transistor or associated circuitry of the die, and exposed portions of the leads 604 allow soldering to a host circuit board (not shown). In one example, the device 600 includes the transistor identified as passing the current collapse testing along with a driver circuitry. The packaged device 600 in one example is constructed by placement of the die on a die attach pad (not shown), electrically connecting conductive features (e.g., pads) of the die to leads by bond wires (not shown), and molding the structure to enclose the die and portions of the leads in the packaged electronic device 600 with exposed lead portions 604 in a pattern on the bottom side thereof.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A method, comprising:
    applying a DC stress condition to a transistor for a predetermined stress time, the DC stress condition including:
        applying a non-zero drain voltage signal to a drain terminal of the transistor,
        applying a gate voltage signal to a gate terminal of the transistor, and
        applying a non-zero source current signal to a source terminal of the transistor;
    measuring an impedance of the transistor after the predetermined stress time; and
    repeating the application of the DC stress condition and the measurement of the impedance until a measured impedance exceeds a non-zero impedance threshold or a total stress time exceeds a non-zero time threshold.

2. The method of claim 1, further comprising:
    identifying the transistor as failed if the measured impedance exceeds the non-zero impedance threshold; and
    identifying the transistor as passed if the total stress time exceeds the non-zero time threshold.

3. The method of claim 1, further comprising:
    engaging probe pins of a wafer test system with conductive features of a wafer, the conductive features connected to terminals of the transistor; and
    applying the DC stress condition from a circuit of the wafer test system to the transistor through the probe pins to the conductive features of the wafer.

4. The method of claim 1, further comprising:
    in response to the measured impedance not exceeding the non-zero impedance threshold and the total stress time not exceeding the non-zero time threshold, increasing the predetermined stress time for each successive repetition of the application of the DC stress condition.

5. The method of claim 1, wherein measuring the impedance of the transistor includes measuring an on-state drain-source resistance of the transistor.

6. The method of claim 1, wherein applying the non-zero source current signal to the source terminal of the transistor includes sinking a constant non-zero current from the source terminal of the transistor during the predetermined stress time.

7. The method of claim 6,
    wherein applying the non-zero drain voltage signal to the drain terminal of the transistor includes applying a constant non-zero drain voltage signal to the drain terminal of the transistor during the predetermined stress time; and
    wherein applying the gate voltage signal to the gate terminal of the transistor includes applying a constant gate voltage signal to the gate terminal of the transistor during the predetermined stress time.

8. The method of claim 1, further comprising:
    testing multiple transistors at respective locations of a wafer, including, for each of the transistors:
        applying the DC stress condition to the transistor for the predetermined stress time,
        measuring the impedance of the transistor after the predetermined stress time, and
        repeating the application of the DC stress condition and the measurement of the impedance until a measured impedance exceeds the non-zero impedance threshold or a total stress time exceeds the non-zero time threshold,
        identifying the transistor as failed if the measured impedance exceeds the non-zero impedance threshold, and
        identifying the transistor as passed if the total stress time exceeds the non-zero time threshold; and
    identifying a wafer guard band radius between a first transistor of the multiple transistors at a respective first wafer location identified as passed, and a second transistor of the multiple transistors at a respective second wafer location identified as failed.

9. The method of claim 1, wherein the transistor is a high electron mobility transistor.

10. A method, comprising:
    testing multiple high electron mobility transistors (HEMTs) at respective locations of a wafer, including, for each of HEMT:
        applying a DC stress condition to the HEMT for a predetermined stress time,
        measuring an impedance of the HEMT after the predetermined stress time, and
        repeating the application of the DC stress condition and the measurement of the impedance until a measured impedance exceeds a non-zero impedance threshold or a total stress time exceeds a non-zero time threshold,
        identifying the HEMT as failed if the measured impedance exceeds the non-zero impedance threshold, and
        identifying the HEMT as passed if the total stress time exceeds the non-zero time threshold;
    identifying a wafer guard band radius between a first HEMT of the multiple HEMTs at a first wafer location identified as passed, and a second HEMT of the multiple HEMTs at a second wafer location identified as failed;
    slicing the wafer; and
    packaging the first HEMT of the multiple HEMTs at the first wafer location identified as passed.

11. The method of claim 10, wherein applying the DC stress condition to the HEMT includes:
    applying a non-zero drain voltage signal to a drain terminal of the HEMT;

applying a gate voltage signal to a gate terminal of the HEMT; and applying a non-zero source current signal to a source terminal of the HEMT.

12. A wafer test system, comprising:

a current source, including a current source output adapted to be coupled to a source terminal of a transistor of a wafer;

a first voltage source, including a first voltage source output adapted to be coupled to a drain terminal of the transistor;

a second voltage source, including a second voltage source output adapted to be coupled to a gate terminal of the transistor;

an impedance measurement circuit, including respective inputs adapted to be coupled to the source terminal and to the drain terminal of the transistor; and a controller configured to:

control the current source, the first voltage source, and the second voltage source to apply a DC stress condition to the transistor for a predetermined stress time, control the impedance measurement circuit to measure an impedance of the transistor after the predetermined stress time, and control the current source, the first voltage source, the second voltage source, and the impedance measurement circuit to repeat the application of the DC stress condition and the measurement of the impedance until a measured impedance exceeds an impedance threshold or a total stress time exceeds a non-zero time threshold, identify the transistor as failed if the measured impedance exceeds the non-zero impedance threshold, and identify the transistor as passed if the total stress time exceeds the non-zero time threshold.

13. The wafer test system of claim 12, wherein the controller is configured to:

control the current source to generate a non-zero DC source current signal at the current source output for the predetermined stress time, and to control the current source to discontinue the non-zero DC source current signal while the impedance measurement circuit measures the impedance of the transistor;

control the first voltage source to generate a non-zero DC drain voltage signal at the first voltage source output for the predetermined stress time; and control the second voltage source to generate a DC gate voltage signal at the second voltage source output for the predetermined stress time.

14. The wafer test system of claim 13, wherein the controller is configured to:

control the first voltage source to generate a second non-zero DC drain voltage signal while the impedance measurement circuit measures the impedance of the transistor; and control the second voltage source to generate a second DC gate voltage signal while the impedance measurement circuit measures the impedance of the transistor.

15. The wafer test system of claim 12, further comprising:

a probe card, including:

a first probe pin adapted to be coupled to a first conductive feature of the wafer to electrically connect the current source output to the source terminal of a transistor, a second probe pin adapted to be coupled to a second conductive feature of the wafer to electrically connect the first voltage source output to the drain terminal of the transistor; and a third probe pin adapted to be coupled to a third conductive feature of the wafer to electrically connect the second voltage source output to the gate terminal of the transistor; and an electronic test circuit connected to the first, second, and third probe pins, the electronic test circuit including the current source, the first voltage source, the second voltage source, the impedance measurement circuit, and the controller.

16. The wafer test system of claim 15, further comprising:

a positioner apparatus configured to move the wafer relative to the probe card; and a second controller configured to control the positioner apparatus to move the wafer between different positions that couple respective conductive pads of the wafer to the first, second, and third probe pins to sequentially test multiple transistors at multiple wafer locations; and wherein the controller is configured, for each respective transistor and respective wafer location, to:

control the current source, the first voltage source, and the second voltage source to apply the DC stress condition to the transistor for the predetermined stress time, control the impedance measurement circuit to measure an impedance of the transistor after the predetermined stress time, and control the current source, the first voltage source, the second voltage source, and the impedance measurement circuit to repeat the application of the DC stress condition and the measurement of the impedance until a measured impedance exceeds the non-zero impedance threshold or a total stress time exceeds the non-zero time threshold, identify the transistor as failed if the measured impedance exceeds the non-zero impedance threshold, and identify the transistor as passed if the total stress time exceeds the non-zero time threshold.

17. The wafer test system of claim 16, wherein the controller is configured to identify a wafer guard band radius between a first transistor at a respective first wafer location identified as passed, and a second transistor at a respective second wafer location identified as failed.

18. The wafer test system of claim 17, further comprising a memory configured to store test results that indicate whether the respective transistors were identified as failed or passed, and to store the wafer guard band radius.

19. The wafer test system of claim 12, wherein the controller is configured to increase the predetermined stress time for each successive repetition of the application of the DC stress condition in response to the measured impedance not exceeding the non-zero impedance threshold and the total stress time not exceeding the non-zero time threshold.

20. The wafer test system of claim 12, wherein the transistor is a high electron mobility transistor.

* * * * *